US006958273B2

(12) United States Patent
Chen et al.

(10) Patent No.: US 6,958,273 B2
(45) Date of Patent: Oct. 25, 2005

(54) SELF-ALIGNED METHOD OF FORMING A SEMICONDUCTOR MEMORY ARRAY OF FLOATING GATE MEMORY CELLS WITH BURIED FLOATING GATE, POINTED FLOATING GATE AND POINTED CHANNEL REGION, AND A MEMORY ARRAY MADE THEREBY

(75) Inventors: Bomy Chen, Cupertino, CA (US); Dana Lee, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 82 days.

(21) Appl. No.: 10/394,975

(22) Filed: Mar. 21, 2003

(65) Prior Publication Data

US 2004/0197996 A1 Oct. 7, 2004

(51) Int. Cl.[7] .......................................... H01L 21/8247
(52) U.S. Cl. ...................................... 438/259; 438/266
(58) Field of Search ................................ 438/259, 266, 438/267, 270, 589

(56) References Cited

U.S. PATENT DOCUMENTS

| 4,757,360 A | 7/1988 | Farone |
| 4,794,565 A | 12/1988 | Wu et al. |
| 4,882,707 A | 11/1989 | Mizutani |

(Continued)

FOREIGN PATENT DOCUMENTS

EP     0 389 721 A2 * 10/1990

OTHER PUBLICATIONS

U.S. Appl. No. 10/393,896, filed Mar. 21, 2003, Bomy Chen et al.

Hayashi, et al., "A Self–Aligned Split–Gate Flash EEPROM Cell With 3–D Pillar Structure," 1999 Symposium on VLSI Technology Digest of Technical Papers, pp. 87–88, Center for Integrated Systems, Stanford University, Stanford, CA 94305, USA.

Primary Examiner—Chandra Chaudhari
(74) Attorney, Agent, or Firm—DLA Piper Rudnick Gray Cary US LLP

(57) ABSTRACT

A method of forming a floating gate memory cell array, and the array formed thereby, wherein a trench is formed into the surface of a semiconductor substrate. The source and drain regions are formed underneath the trench and along the substrate surface, respectively, with a non-linear channel region therebetween. The floating gate has a lower portion disposed in the trench and an upper portion disposed above the substrate surface and having a lateral protrusion extending parallel to the substrate surface. The lateral protrusion is formed by etching a cavity into an exposed end of a sacrificial layer and filling it with polysilicon. The control gate is formed about the lateral protrusion and is insulated therefrom. The trench sidewall meets the substrate surface at an acute angle to form a sharp edge that points toward the floating gate and in a direction opposite to that of the lateral protrusion.

41 Claims, 11 Drawing Sheets

U.S. PATENT DOCUMENTS

| | | |
|---|---|---|
| 4,905,062 A | 2/1990 | Esquivel et al. |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,049,959 A | 9/1991 | Satoh |
| 5,101,250 A | 3/1992 | Arima et al. |
| 5,268,319 A | 12/1993 | Harari |
| 5,386,132 A | 1/1995 | Wong |
| 5,429,965 A | 7/1995 | Shimoji |
| 5,544,103 A | 8/1996 | Lambertson |
| 5,572,054 A | 11/1996 | Wang et al. |
| 5,780,341 A | 7/1998 | Ogura |
| 5,780,892 A | 7/1998 | Chen |
| 5,786,612 A * | 7/1998 | Otani et al. ............. 257/316 |
| 5,789,293 A * | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,091,104 A | 7/2000 | Chen |
| 6,103,573 A | 8/2000 | Harari et al. |
| 6,130,453 A | 10/2000 | Mei et al. |
| 6,140,182 A * | 10/2000 | Chen |
| 6,159,796 A * | 12/2000 | Dietz et al. ............. 438/259 |
| 6,222,227 B1 | 4/2001 | Chen |
| 6,262,917 B1 | 7/2001 | Lee |
| 6,368,917 B1 | 4/2002 | Kalnitsky et al. ........ 438/259 |
| 6,525,371 B2 | 2/2003 | Johnson |

* cited by examiner

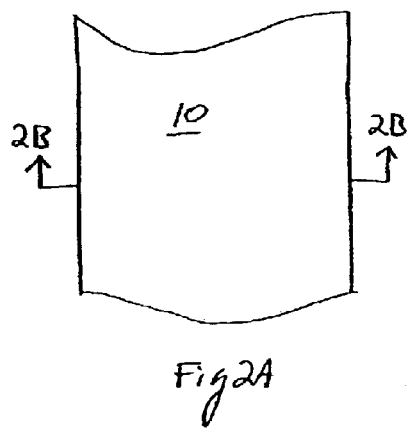
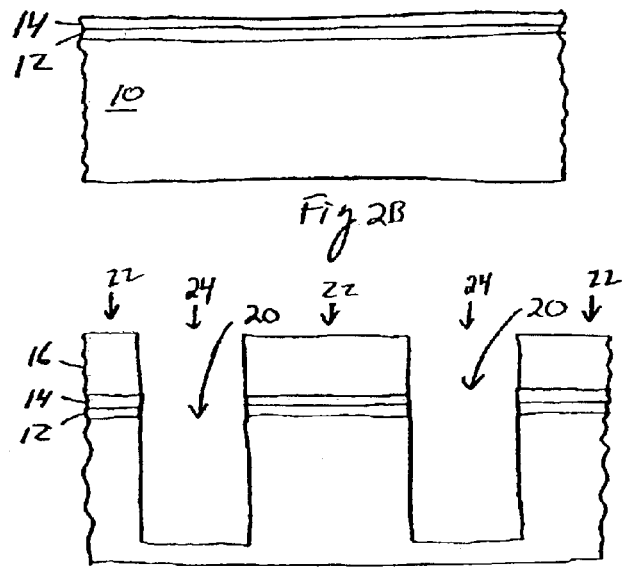
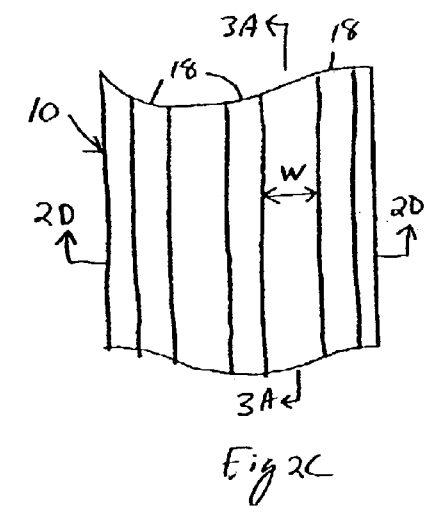
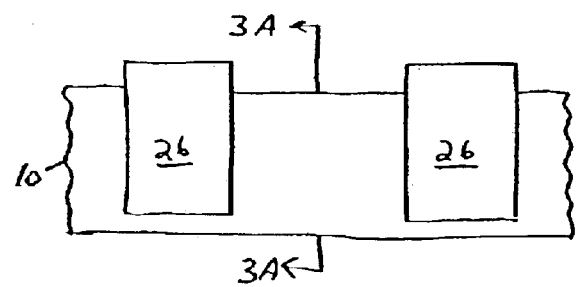

SELF-ALIGNED METHOD OF FORMING A SEMICONDUCTOR MEMORY ARRAY OF FLOATING GATE MEMORY CELLS WITH BURIED FLOATING GATE, POINTED FLOATING GATE AND POINTED CHANNEL REGION, AND A MEMORY ARRAY MADE THEREBY

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions. The bit-line area is often occupied by the contact openings between memory cell pairs, and the contact to wordline spacing, which strongly depends upon lithography generation, contact alignment and contact integrity. In addition, significant space is reserved for the word-line transistor, the size of which is set by lithography generation and junction scaling.

Traditionally, floating gates are formed with a sharp edge facing a control gate to enhance Fowler-Nordheim tunneling, which is used to move electrons off of the floating gate during an erase operation. The sharp edge is typically formed by oxidizing or partially etching the top surface of the floating gate poly in an uneven manner. In order to enhance the oxidation process, the floating gate poly is typically lightly doped to avoid the formation of large grains. However, as the dimensions of the floating gate get smaller, the grains of the polysilicon (which are enlarged due to the thermal cycles of the oxidation process) become significant in size compared to the overall size of the floating gate. The large grain size relative to the size of the floating gate causes the sharp edge to be unevenly formed, which compromises the operation and functionality of the floating gate.

There is also a need to improve the programming efficiency of memory cell array. FIG. 1 illustrates a well known split-gate non-volatile memory cell design, that includes a floating gate 1 and a control gate 2 that are insulated from each other by an insulation material 3 and are formed over a substrate 4. A source region 5 and a drain region 6 are formed in the substrate 4, with a channel region therebetween. In conventional programming schemes, the electrons in the channel region flow from the drain 6 to the source 5 in a path parallel to the floating gate 1, where a relatively small number of the heated electrons are injected onto the floating gate 1. The estimated program efficiency (number of electrons injected compared to total number of electrons) is estimated at about 1/1000.

There is also a need to increase the erasing efficiency and reliability of the memory cell array. To erase the memory cell shown in FIG. 1, the electric potential of the control gate 2 is increased until electrons on the floating gate 1 tunnel from a sharp tip 7 of the floating gate 1 through the insulation material 3 and onto the control gate 2 via Fowler-Nordheim tunneling. However, the electric field lines 8 between the floating gate tip 7 and the adjacent control gate surface 9 are asymmetric, with a much stronger electric field line density near the floating gate tip 7 compared to that near the control gate surface 9. Defects and oxide degradation from excessive electric fields tend to occur in the insulation material 3 where the electric field line density is the greatest. Thus, the asymmetric electric field line density near the floating gate tip 7 limits the maximum voltages usable to erase the memory cells, and limits the scalability of the memory cell size.

There is a need for a non-volatile, floating gate type memory cell array with significant cell size reduction while providing enhanced programming and erase efficiency and memory cell reliability.

SUMMARY OF THE INVENTION

The present invention solves the above mentioned problems by providing a self aligned method of forming memory cells with reduced size and novel structure, and a memory cell array formed thereby.

The present invention is an electrically programmable and erasable memory device that includes a substrate of semiconductor material having a first conductivity type and a surface, a trench formed into the substrate surface, first and second spaced-apart regions formed in the substrate and having a second conductivity type, with a channel region formed in the substrate therebetween, wherein the first region is formed underneath the trench, and the channel region includes a first portion that extends substantially along a sidewall of the trench and a second portion that extends substantially along the substrate surface, an electrically conductive floating gate having lower and upper portions, wherein the lower portion is disposed in the trench adjacent to and insulated from the channel region first portion, and wherein the upper portion extends above the substrate surface and includes a lateral protrusion that extends in a direction substantially parallel to the substrate surface, and an electrically conductive control gate that is disposed over and insulated from the channel region second portion, and is disposed laterally adjacent to and insulated from the floating gate lateral protrusion.

In another aspect of the present invention, an array of electrically programmable and erasable memory devices includes a substrate of semiconductor material having a first conductivity type and a surface, spaced apart isolation regions formed on the substrate which are substantially parallel to one another and extend in a first direction, with an active region between each pair of adjacent isolation regions, and each of the active regions includes a plurality of memory cells. Each of the memory cells includes a trench formed into the substrate surface, first and second spaced-apart regions formed in the substrate and having a second conductivity type, with a channel region formed in the substrate therebetween, wherein the first region is formed underneath the trench, and the channel region includes a first portion that extends substantially along a sidewall of the trench and a second portion that extends substantially along the substrate surface, an electrically conductive floating gate having lower and upper portions, wherein the lower portion is disposed in the trench adjacent to and insulated from the channel region first portion, and wherein the upper portion extends above the substrate surface and includes a lateral protrusion that extends in a direction substantially parallel to the substrate surface, and an electrically conductive control gate that is disposed over and insulated from the channel region second portion, and is disposed laterally adjacent to and insulated from the floating gate lateral protrusion.

In yet another aspect of the present invention, a method of forming a semiconductor memory cell includes forming a trench into a surface of a semiconductor substrate of a first conductivity type, forming first and second spaced-apart regions of a second conductivity type in the substrate with the first region formed underneath the trench, wherein a channel region is defined in the substrate between the first and second regions such that the channel region includes a first portion that extends substantially along a sidewall of the trench and a second portion that extends substantially along the substrate surface, forming an electrically conductive floating gate having lower and upper portions, wherein the lower portion is disposed in the trench adjacent to and insulated from the channel region first portion, and wherein the upper portion extends above the substrate surface and includes a lateral protrusion that extends in a direction substantially parallel to the substrate surface, and forming an electrically conductive control gate that is disposed over and insulated from the channel region second portion, and is disposed laterally adjacent to and insulated from the floating gate lateral protrusion.

In yet one more aspect of the present invention, a method of forming an array of electrically programmable and erasable memory devices includes forming spaced apart isolation regions on a semiconductor substrate that are substantially parallel to one another and extend in a first direction, with an active region between each pair of adjacent isolation regions, wherein the substrate has a surface and a first conductivity type, and forming a plurality of memory cells in each of the active regions. The formation of each of the memory cells includes forming a trench into a surface of a semiconductor substrate of a first conductivity type, forming first and second spaced-apart regions of a second conductivity type in the substrate with the first region formed underneath the trench, wherein a channel region is defined in the substrate between the first and second regions such that the channel region includes a first portion that extends substantially along a sidewall of the trench and a second portion that extends substantially along the substrate surface, forming an electrically conductive floating gate having lower and upper portions, wherein the lower portion is disposed in the trench adjacent to and insulated from the channel region first portion, and wherein the upper portion extends above the substrate surface and includes a lateral protrusion that extends in a direction substantially parallel to the substrate surface, and forming an electrically conductive control gate that is disposed over and insulated from the channel region second portion, and is disposed laterally adjacent to and insulated from the floating gate lateral protrusion.

Other objects and features of the present invention will become apparent by a review of the specification, claims and appended figures.

BRIEF DESCRIPTION OF THE DRAWINGS

FIG. 2A is a top view of a semiconductor substrate used in the first step of the method of present invention to form isolation regions.

FIG. 2B is a cross sectional view of the structure in FIG. 2A taken along the line 2B—2B showing the initial processing steps of the present invention.

FIG. 2C is a top view of the structure showing the next step in the processing of the structure of FIG. 2B, in which isolation regions are defined.

FIG. 2D is a cross sectional view of the structure in FIG. 2C taken along the line 2D—2D showing the isolation trenches formed in the structure.

FIG. 2E is a cross sectional view of the structure in FIG. 2D showing the formation of isolation blocks of material in the isolation trenches.

FIG. 2F is a cross sectional view of the structure in FIG. 2E showing the final structure of the isolation regions.

DETAILED DESCRIPTION OF THE PREFERRED EMBODIMENTS

Figure 1:
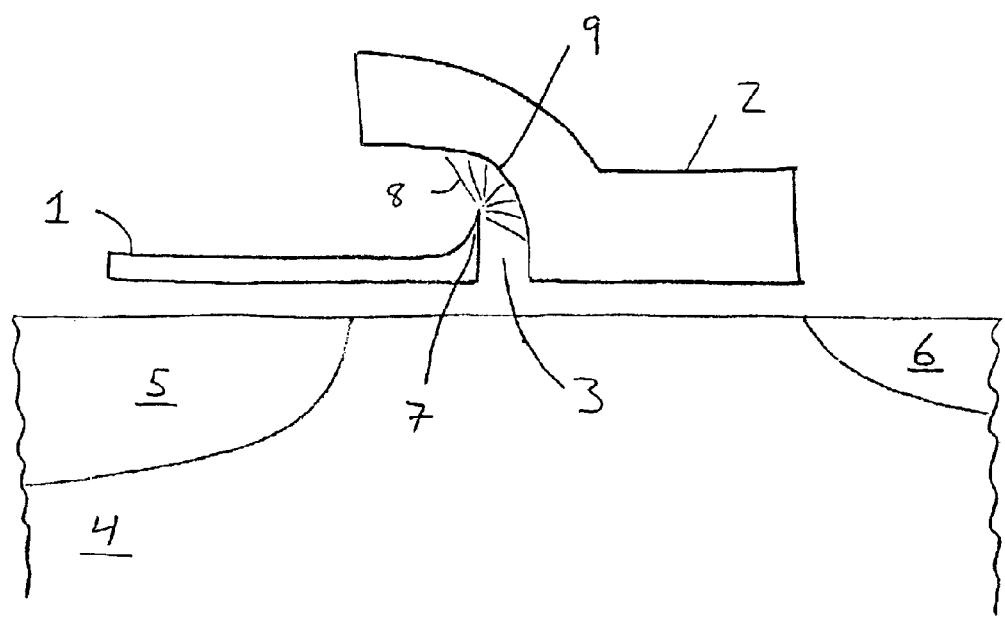
FIG. 1 is a cross sectional view of a conventional non-volatile memory cell.

The method of the present invention is illustrated in FIGS. 2A to 2F and 3A to 3N (which show the processing steps in making the memory cell array of the present invention). The method begins with a semiconductor substrate 10, which is preferably of P type and is well known in the art. The thicknesses of the layers described below will depend upon the design rules and the process technology generation. What is described herein is for the 0.10 micron process. However, it will be understood by those skilled in the art that the present invention is not limited to any specific process technology generation, nor to any specific value in any of the process parameters described hereinafter.

Isolation Region Formation

FIGS. 2A to 2F illustrate the well known STI method of forming isolation regions on a substrate. Referring to FIG.

2A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD to a thickness of approximately 85 A). Second layer 14 can be silicon nitride (hereinafter "nitride"), which is formed over oxide layer 12 preferably by CVD (e.g. to a thickness of approximately 1400 Å). FIG. 2B illustrates a cross-section of the resulting structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 2C. Where the photo-resist material 16 is removed, the exposed nitride layer 14 and oxide layer 12 are etched away in stripes 18 using standard etching techniques (i.e. anisotropic nitride and oxide etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 0.3 $\mu$m), as shown in FIG. 2D. Where the photo resist 16 is not removed, the nitride layer 14 and oxide layer 12 are maintained. The resulting structure illustrated in FIG. 2D now defines active regions 22 interlaced with isolation regions 24.

The structure is further processed to remove the remaining photo resist 16. Then, an isolation material such as silicon dioxide is formed in trenches 20 by depositing a thick oxide layer, followed by a Chemical-Mechanical-Polishing (CMP) etch (using nitride layer 14 as an etch stop) to remove the oxide layer except for oxide blocks 26 in trenches 20, as shown in FIG. 2E. The remaining nitride and oxide layers 14112 are then removed using nitride/oxide etch processes, leaving STI oxide blocks 26 extending along isolation regions 24, as shown in FIG. 2F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18 (e.g. using an oxidation process).

FIGS. 2A to 2F illustrate the memory cell array region of the substrate, in which columns of memory cells will be formed in the active regions 22 that are separated by the isolation regions 24. It should be noted that the substrate 10 may also include at least one periphery region in which control circuitry is formed that will be used to operate the memory cells formed in the memory cell array region. Preferably, isolation blocks 26 are also formed in the periphery region during the same STI or LOCOS process described above.

Memory Cell Formation

Figure 3A:
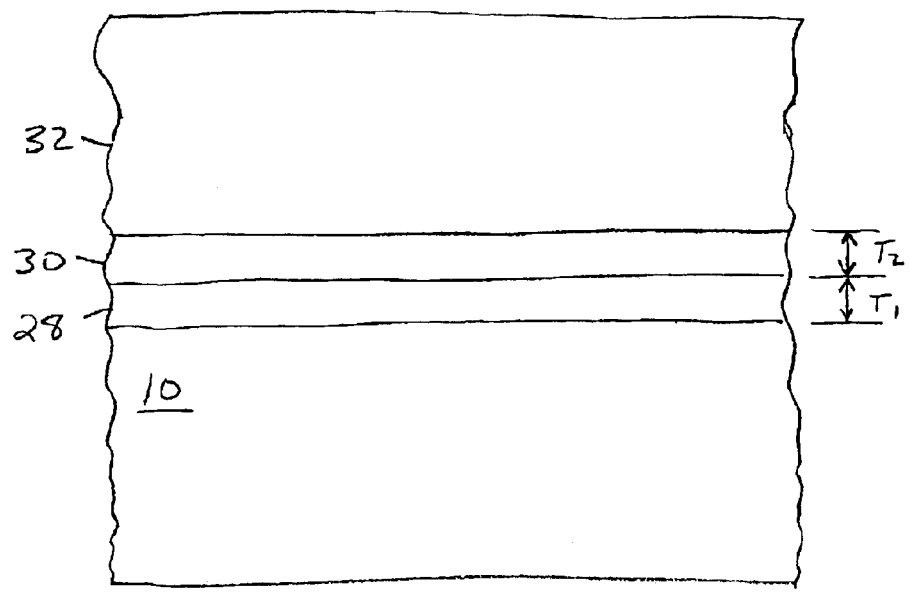
FIGS. 3A–3N are cross sectional views of the semiconductor structure in FIG. 2F taken along the line 3A—3A showing in sequence the steps in the processing of the semiconductor structure in the formation of a non volatile memory array of floating gate memory cells of the present invention.
Figure 3B:
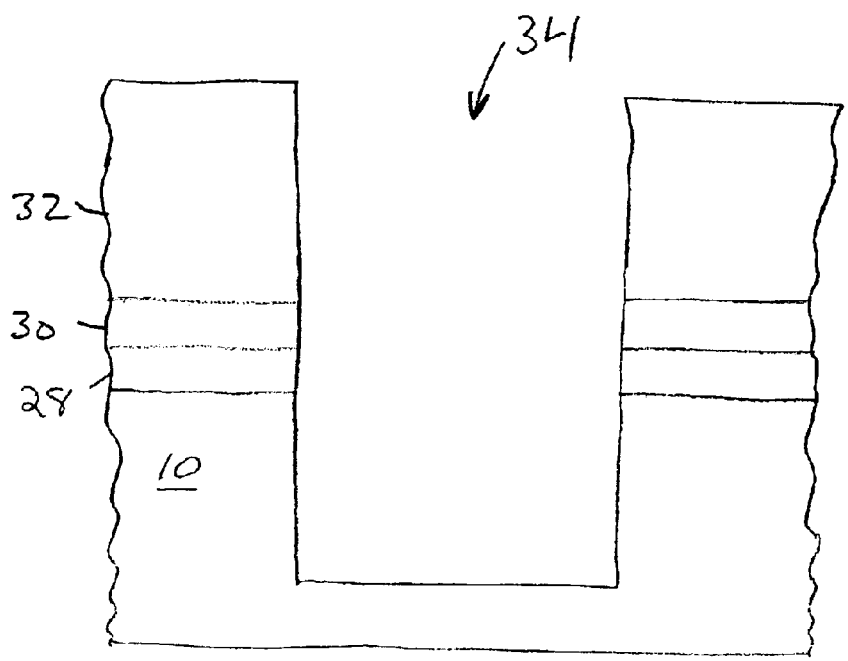
Figure 3C:
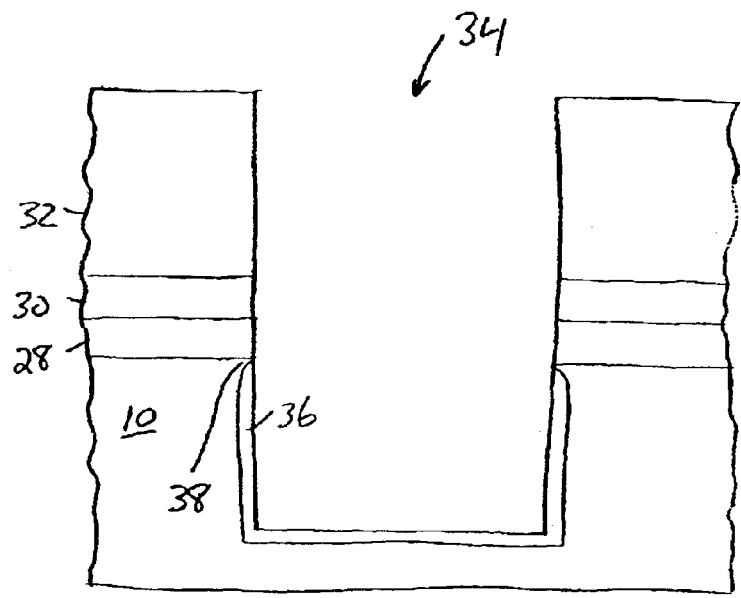
Figure 3D:
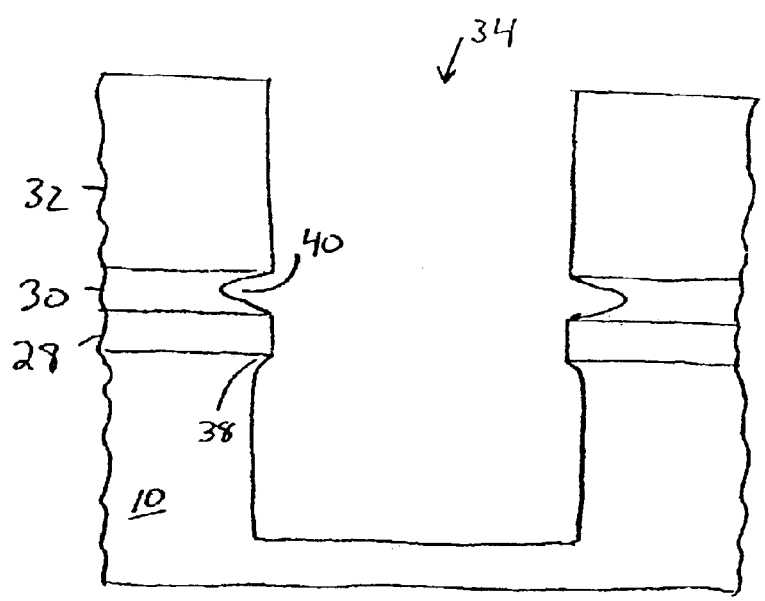
Figure 3E:
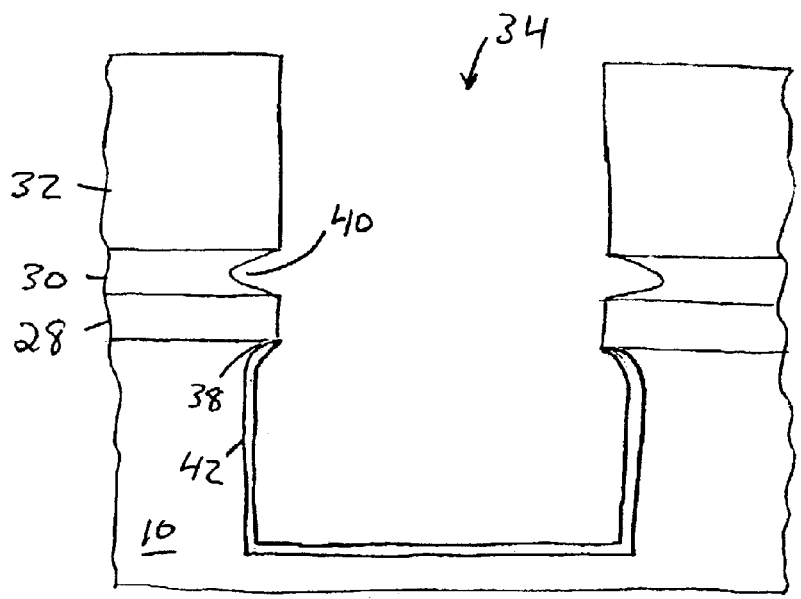

The structure shown in FIG. 2F is further processed as follows. FIGS. 3A to 3N show the cross sections of the structure in the active regions 22 from a view orthogonal to that of FIG. 2F (along line 3A—3A as shown in FIGS. 2C and 2F), as the next steps in the process of the present invention are performed concurrently in both regions.

A pair of sacrificial layers of material 28 and 30 are formed over the substrate, as shown in FIG. 3A. Preferably, layer 28 is nitride, which can be formed, for example, by LPCVD (low pressure chemical vapor deposition), with a thickness $T_1$, (e.g. 60 to 80 Å). Preferably, layer 30 is oxide, which can be formed, for example, by TEOS (tetra-ethyl-ortho-silicate) or BSG (BoroSilicateGlass) or BPSG (Phospho/BoroPhoso-Silicate), with a thickness $T_2$ (e.g. 50 to 100 Å). The active region portions of the substrate 10 can be doped after layer 28 (and possibly after layer 30) are formed for better independent control of the cell array portion of the memory device relative to the periphery region. Such doping is often referred to as a $V_t$, implant or cell well implant, and is well known in the art. During this implant, the periphery region is protected by a photo resist layer, which is deposited over the entire structure and removed from just the memory cell array region of the substrate. After the optional $V_t$ implant, a thick layer of hard mask material 32 (e.g. nitride with 2000 to 3100 Å thickness) is formed over oxide layer 30. The resulting active region structure is shown in FIG. 3A.

A plurality of parallel second trenches 34 are formed in the nitride layer 32 by applying a photo resist (masking) material on the nitride layer 32, and then performing a masking step to remove the photo resist material from selected parallel stripe regions (which are perpendicular to the isolation regions 24). An anisotropic nitride etch is used to remove the exposed portions of nitride layer 32 in the stripe regions, leaving second trenches 34 that extend down to and expose oxide layer 30. Anisotropic oxide and nitride etches are then performed to remove the exposed portions of oxide layer 30 and nitride layer 28 at the bottom of second trenches 34, leaving portions of substrate 10 exposed. A silicon anisotropic etch process is next used to extend second trenches 34 down into the substrate 10 (for example, down to a depth of approximately one feature size deep, e.g. about 0.15 um deep with 0.15 um technology). FIG. 3B shows the resulting structure after the photo resist is removed.

A thermal oxidation process is then used to form a sacrificial oxide layer 36 (e.g. 200–600 Å thick) along the exposed portions of substrate 10 in second trenches 34. This oxidation process sharpens substrate edges 38 (where the second trench substrate sidewalls now meet the substrate's upper surface at an acute angle—below 90 degrees), because the nitride layer 28 reduces the affects of the oxidation process on the substrate sidewalls near the substrate's upper surface. The resulting structure is shown in FIG. 3C.

A selective, isotropic oxide etch, such as a wet oxide etch, is performed to remove oxide layer 36, as well as any etch damage and contamination from the exposed substrate material in second trenches 34. This oxide etch also removes exposed end portions of oxide layer 30 (where it meets second trenches 34), forming cavities 40 that laterally extend away from second trenches 34, as shown in FIG. 3D. The formation of cavities 40 is a self limiting process, where the oxide etch laterally extends into oxide layer 30 only a certain distance (depending on the thickness of the oxide layer 30) and then essentially stops removing oxide. Thus, the size and depth of cavities 40 in oxide layer 30 are dictated by the thickness $T_2$ of oxide layer 30 (i.e. the larger the thickness $T_2$, the larger the size and depth of cavities 40). The size and depth of cavities 40 can therefore be accurately and repeatably controlled by selecting the desired thickness $T_2$ of oxide layer 30.

A second thermal oxidation process is used to form another oxide layer 42 (e.g. 60–80 Å thick) along the exposed side and bottom walls of second trenches 34 in substrate 10. This subsequent oxidation process further enhances the sharpness and size of the sharp substrate edges 38, where the second trench substrate sidewalls preferably meet the substrate's upper surface at an angle substantially less than 90 degrees (e.g. 70–85 degrees). Another $V_t$ implant or cell well implant can be performed at this time, since the only portions of the substrate not protected by nitride layer 32 are those portions in second trenches 34. The resulting structure is shown in FIG. 3E. It should be noted that the sharpness of the sharp substrate edges 38 can be further enhanced if necessary by performing additional oxide etch and oxidation processes.

Figure 3F:
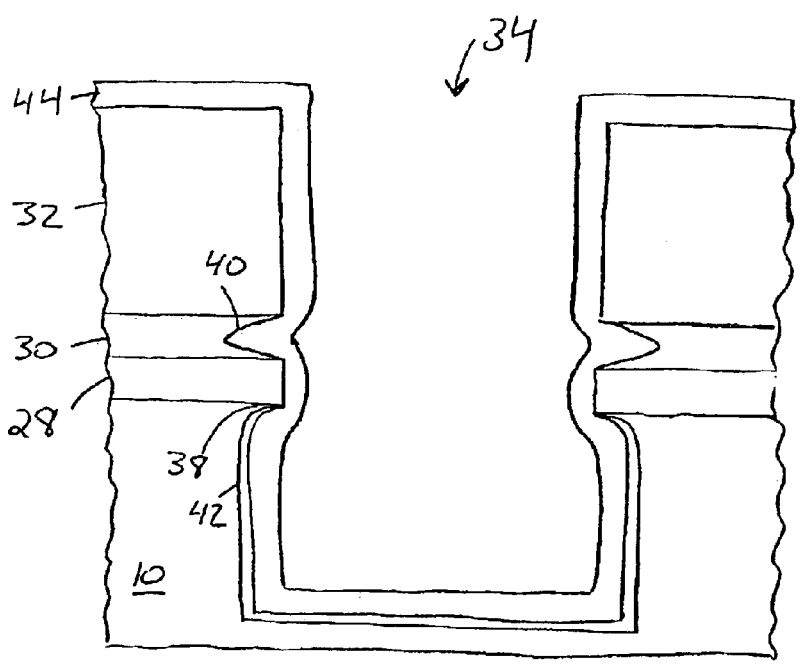
Figure 3G:
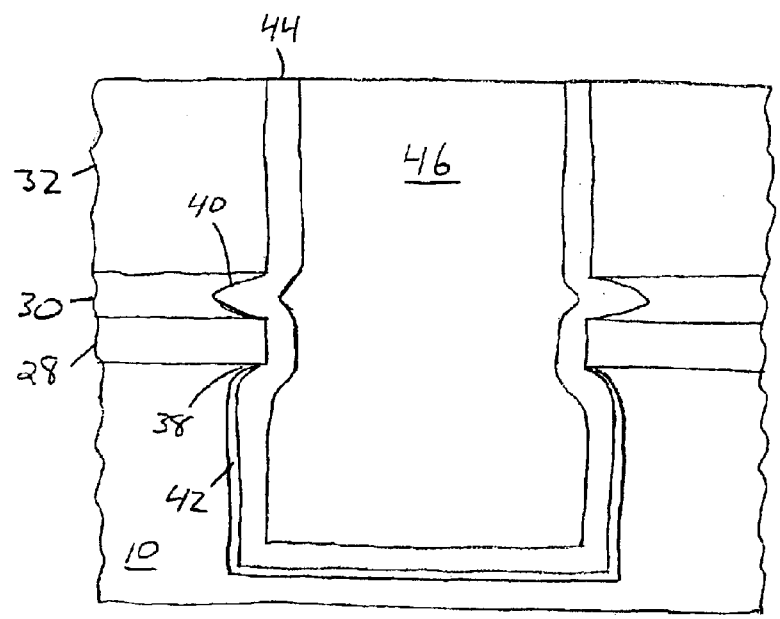

A layer of doped polysilicon 44 (hereinafter "poly") is then formed over the structure (e.g. As or P in-situ doped, 200 to 500 Å thick), which lines the walls and bottom surfaces of second trenches 34 and fills cavities 40, as shown in FIG. 3F. A thick layer of undoped polysilicon is then deposited over the structure, followed by a planarizing poly etch (e.g. CMP using nitride layer 32 as an etch stop) which fills second trenches 34 with poly blocks 46. The resulting structure is shown in FIG. 3G.

Figure 3H:
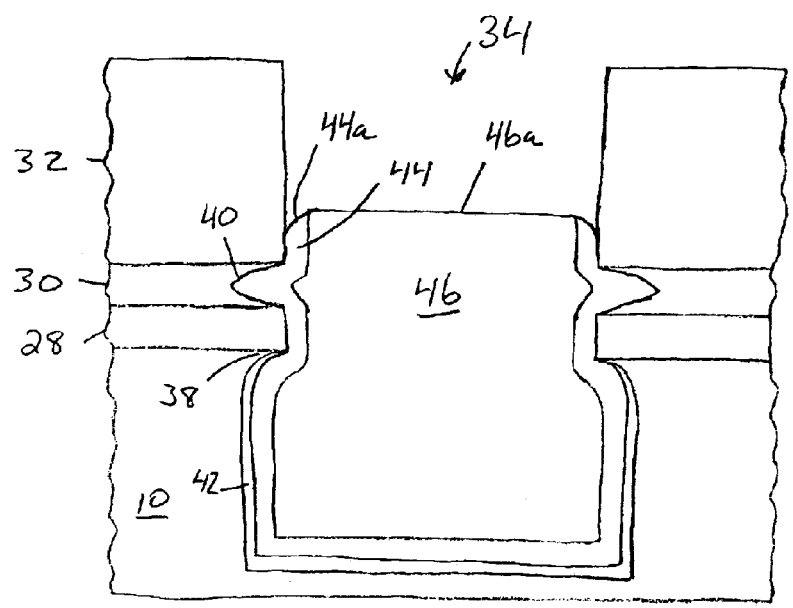
Figure 3I:
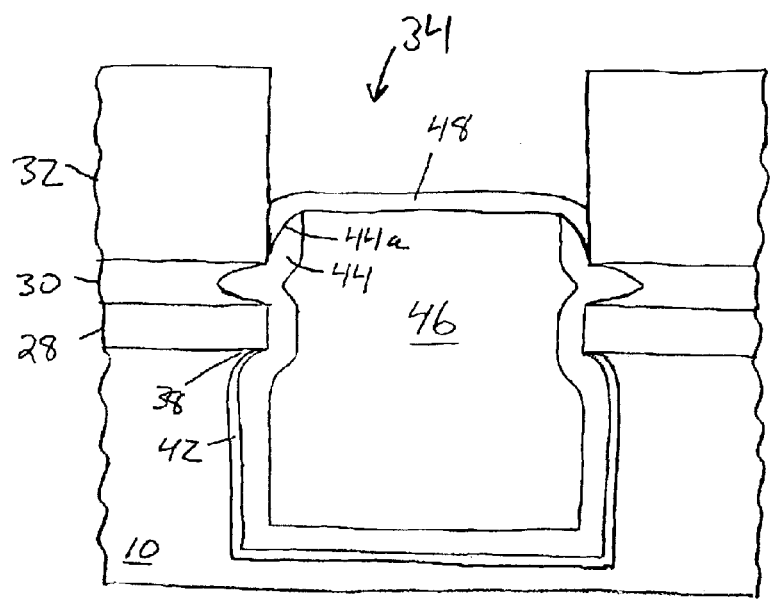

A poly etch process next performed on the structure to recess the tops of poly layer 44 and poly block 66 in each second trench 34. This poly etch is preferably a timed etch process, which reduces the height of poly blocks 46 below the top of nitride layer 32, but preferably at least 300 Å above the upper surface of oxide layer 30. Because doped polysilicon etches faster than undoped polysilicon, the upper surface 44a of poly layer 44 is etched down lower than the upper surface 46a of poly block 46 (e.g. upper surface 44a slopes downwardly as it extends away from upper surface 46a), as shown in FIG. 3H. The slope of upper surface 44a is enhanced with a thermal oxidation process, which forms oxide layer 48 over poly layer 44 and poly block 46. The slope of upper surface 44a is enhanced because doped polysilicon oxides faster than undoped polysilicon. The resulting structure is shown in FIG. 3I.

Figure 3J:
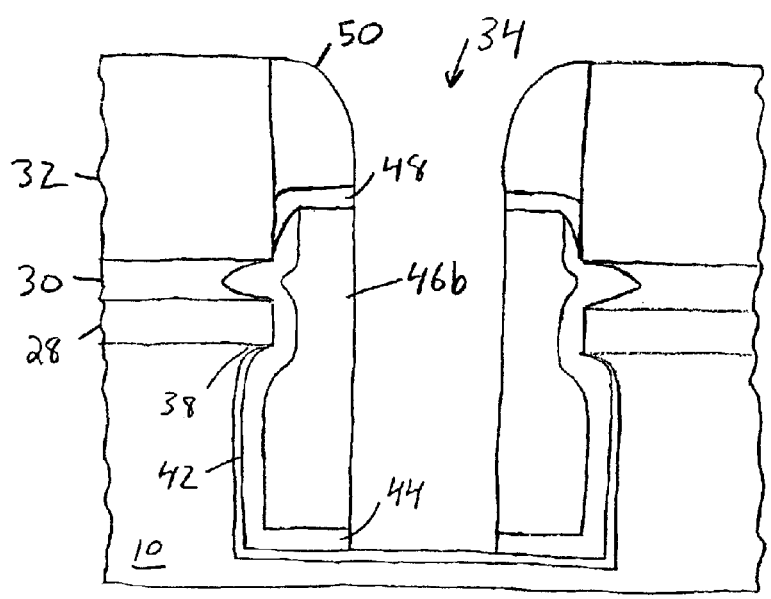

Spacers 50 are next formed along nitride layer 32 in second trenches 34. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. In the present embodiment, spacers 50 are formed by depositing a layer of material (e.g. oxide) over the entire structure, followed by an anisotropic oxide etch process, such as the well known Reactive Ion Etch (RIE), to remove the deposited oxide layer except for spacers 50. The oxide etch also removes center portions of oxide layer 48 to expose a center portion of poly block 46 in each second trench 34. An anisotropic poly etch is next performed, which removes the exposed center portions of the poly blocks 46, and poly layer 44, that are not protected by oxide spacers 50, leaving a pair of opposing poly blocks 46b in each of the second trenches 34, and an exposed center portion of oxide layer 42 in each second trench 34. The resulting structure is shown in FIG. 3J.

Figure 3K:
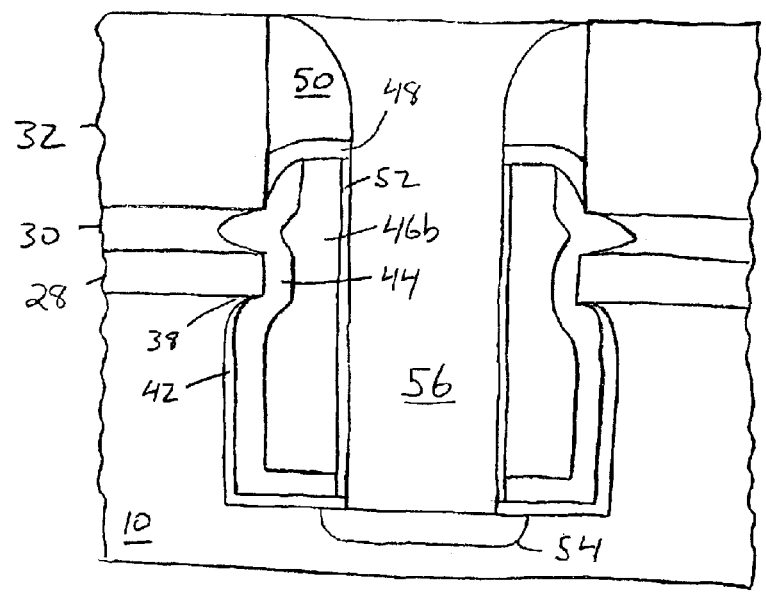

An insulation deposition and anisotropic etch-back process is then used to form an insulation layer 52 (e.g. 150 Å thick) along the exposed sides of poly blocks 46b and the exposed end portions of poly layer 44. The insulation layer 52 could be formed with any appropriate insulation material (e.g. ONO—oxide/nitride/oxide, or other high dielectric materials). Preferably, the insulation material is oxide, so that the oxide deposition/etch process also results in the partial or complete removal of the exposed portions of oxide layer 42 at the bottom of each second trench 34. Suitable ion implantation (and possible anneal) is then made across the surface of the structure to form first (source) regions 54 in the exposed substrate portions at the bottom of second trenches 34. The source regions 54 are self aligned to the second trenches 34, and have a second conductivity type (e.g. N type) that is different from a first conductivity type of the substrate or substrate well (e.g. P type). The ions have no significant effect on the nitride layer 32. An anisotropic oxide etch, if needed, is performed to remove any exposed oxide at the bottom of the second trenches 34 to ensure the substrate 10 is exposed. A poly deposition step (preferably in-situ doped), followed by a poly CMP etch (using the nitride layer 32 as an etch stop) are used to fill second trenches 34 with poly blocks 56. The resulting structure is shown in FIG. 3K.

Figure 3L:
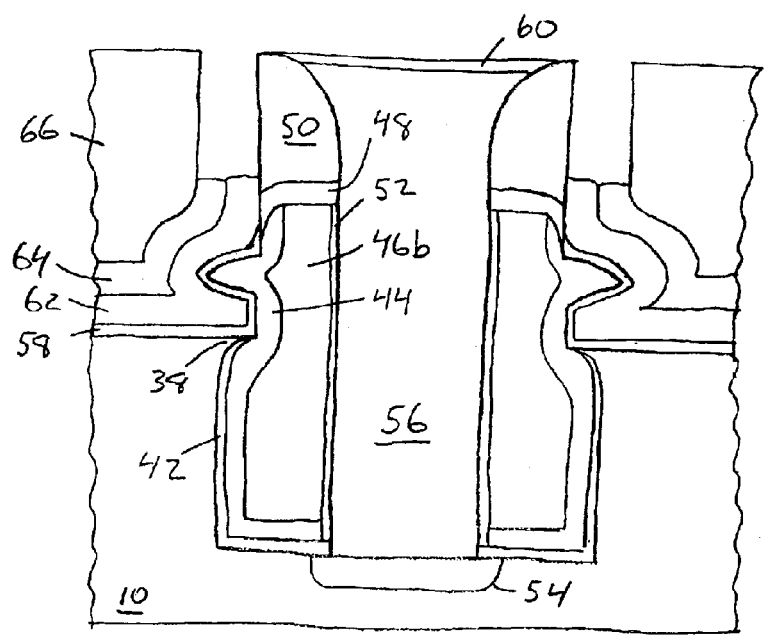

Nitride and oxide etches follow, which remove nitride layers 32/28 and oxide layer 30. A tunnel oxide layer 58 is next formed on the exposed side portions of poly layer 44 and on the exposed portions of substrate 10, either by thermal oxidation, oxide deposition, or both. This oxide formation step also forms an oxide layer 60 (e.g. greater than 400 Å thick) on the exposed top surfaces of poly blocks 56. A poly deposition step is used to form a poly layer 62 over the structure (e.g. approximately 500 Å thick, preferably in-situ doped), which is followed by another deposition step to form a layer of metalized polysilicon 64 over poly layer 62. Photo resist is then deposited over the structure, and etched back leaving a layer of photo resist 66 (e.g. 800–1200 Å thick) having an upper surface that is disposed preferably no higher than oxide layer 60, leaving exposed those portions of the poly layers 62/64 extending up and over poly blocks 56. A poly etch process is then used to remove exposed portions of poly layers 62/64 disposed over poly block 56, and recess portions of these poly layers adjacent to oxide spacers 50 down below the tops of poly blocks 56, but preferably above the tops of oxide layer 58. The resulting structure is shown in FIG. 3L.

Figure 3M:
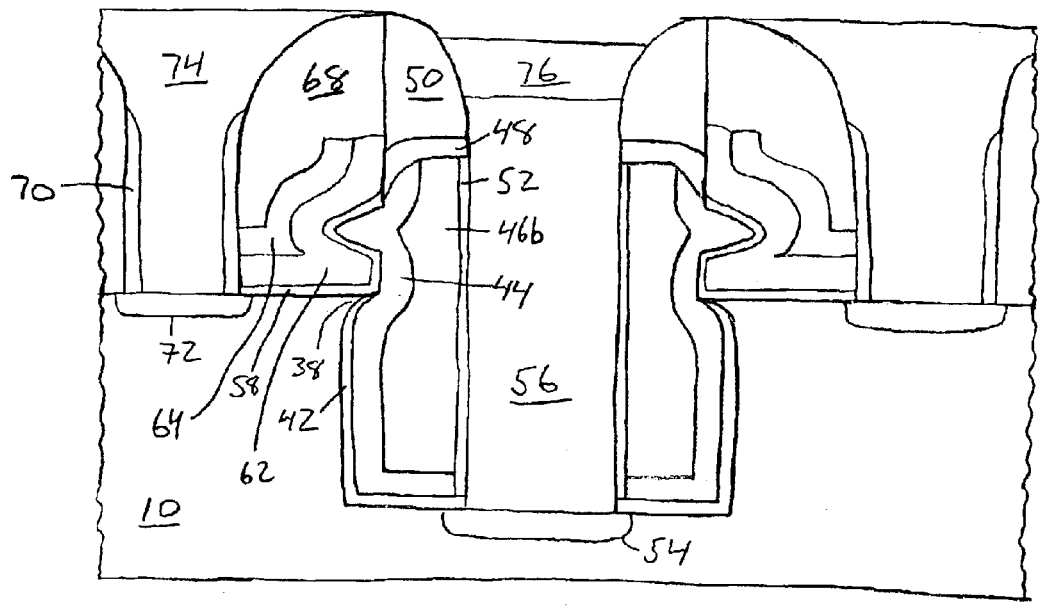
Figure 3N:
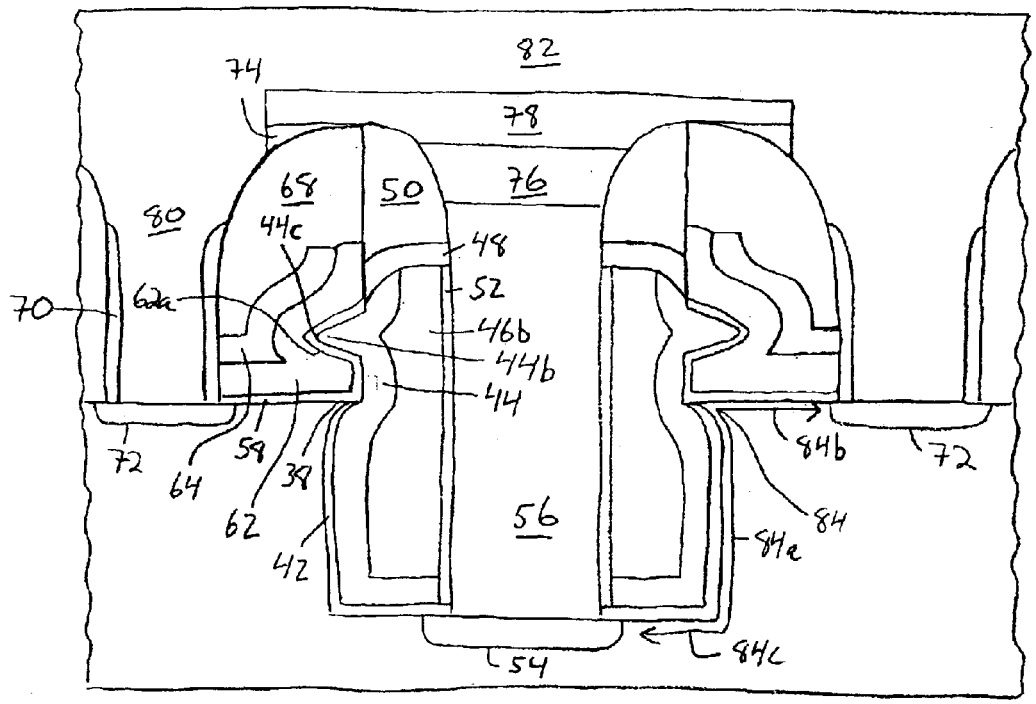

After the photo resist 66 is removed, nitride spacers 68 are formed against oxide spacers 50 (and over portions of poly layers 62/64) by depositing a layer of nitride (e.g. 1300 to 1500 Å thickness) over the structure, followed by an anisotropic nitride etch which leaves the nitride spacers 68 (e.g. ~1300 Å wide). An anisotropic poly etch is then used to remove exposed portions of poly layers 62/64 (i.e. those portions not protected by nitride spacers 68). Insulation (e.g. nitride) spacers 70 are next formed against nitride spacers 68 and exposed end portions of poly layers 62/64 by depositing a layer of nitride (e.g. 200–300 Å thick via CVD), followed by an anisotropic nitride etch. Suitable ion implantation (and anneal) is used to form second (drain) regions 72 in the exposed substrate next to nitride spacers 70. An optional metalization step (not shown) can be used to form conductive metalized silicon (silicide) over the drain regions 72 by depositing a metal such as tungsten, cobalt, titanium, nickel, platinum, or molybdenum over the structure, and annealing the structure to permit a silicidation reaction to take place as the surface of substrate 10. Insulation material 74, such as ILD (interlayer dielectric) is then formed over the entire structure, followed by a reflow and planarization etch process (e.g. CMP etch using nitride spacers 68 as an etch stop). An oxide etch is used next to remove oxide layer 60 over poly blocks 56. The exposed upper portions of poly blocks 56 (between the oxide spacers 50) are then removed using a poly etch, and replaced with tungsten/titanium-nitride 76 that is deposited over the structure (e.g. by CVD) and etched back (preferably recessed below the tops oxide spacers 50). The resulting structure is shown in FIG. 3M.

Another layer of insulation material (e.g. ILD) 78 is then formed over the structure. A dual damascene metalization scheme is preferably used next, which includes the application of a first contact mask leaving only the areas over the drain regions 72 exposed, followed by an ILD etch to form contact openings through the insulation layers 78/74 to expose drain regions 72. The contact openings are then filled with a conductor metal (e.g. tungsten, molybdenum, etc.) by a metal deposition and etch back process to form metal contacts 80 that are electrically connected to drain regions 72, and metal contact lines 82 connecting together all the contacts 80 in each of the active regions 22. The final active region memory cell structure is illustrated in FIG. 3N.

As shown in FIG. 3N, the process of the present invention forms pairs of memory cells that mirror each other, with a memory cell formed on each side of the poly block 56. For each memory cell, first and second regions 54/72 form the source and drain regions respectively (although those skilled in the art know that source and drain can be switched during operation). Channel regions 84 for each memory cell are defined in the surface portion of the substrate that is in-between the source and drain 54/72. Each channel region 84 includes two portions joined together at an approximate right angle, with a first (vertical) portion 84a extending along the vertical wall of filled second trench 34 and a second (horizontal) portion 84b extending between the sidewall of filled second trench 34 and the drain region 72. To the extent source region 54 does not fully occupy the substrate underneath second trench 34, the channel region includes a third portion 84c extending from the channel region vertical portion 84a to the source region 54. Each pair of memory cells share a common source region 54 that is disposed underneath filled second trench 34 and is in electrical contact with poly block 56. Similarly, each drain region 72 is shared between adjacent memory cells from different mirror sets of memory cells.

For each memory cell, poly layer 44 and poly block 46b constitute the floating gate, which is disposed adjacent to the channel region portions 84a/84c and insulated therefrom by oxide layer 42, and adjacent to (source) poly block 56 and insulated therefrom by oxide layer 52. Poly layers 62/64 constitute the control gate for each memory cell, which are disposed over channel region portion 84b and adjacent to floating gate 44/46b, and insulated therefrom by oxide layer 58.

Each floating gate 44/46b includes a lower portion extending up to the surface of the substrate (and opposite sharpened edge 38 of the substrate 10), and an upper portion that extends above the substrate surface. Each floating gate upper portion includes a lateral protrusion 44b (that was formed by filling cavity 40 in sacrificial oxide layer 30) that extends laterally in a direction parallel to the substrate surface and parallel to the channel portion 84b used to program the memory cell. For each memory cell, the tip 44c of lateral protrusion 44b points in a direction opposite to that in which the substrate edge 38 points. The control gate 62/64 includes a lateral cavity 62a formed around and evenly insulated from the floating gate lateral protrusion 44b. Oxide layer 58, which insulates control gate lateral cavity 62a from floating gate lateral protrusion 44b, provides a path for Fowler-Nordheim tunneling therebetween. Poly blocks 56 each extend along and are insulated (by oxide layer 52) from two floating gates 44/46b, for enhanced voltage (capacitive) coupling therebetween.

Figure 4:
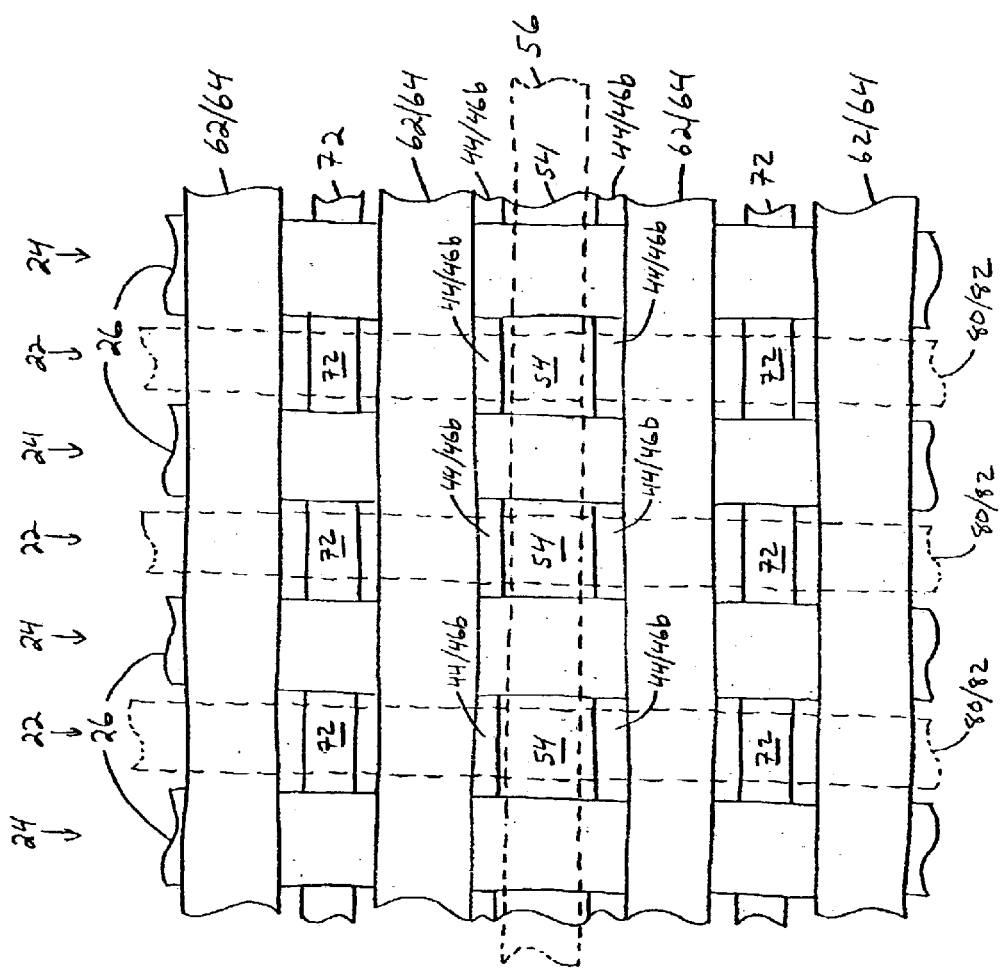
FIG. 4 is a top plan view of the memory cell array of the present invention.

FIG. 4 is a top view of the resulting structure. Contacts 80 and contact lines 82 form conductive drain (bit) lines that each electrically connect together all the drain regions 72 in one of the each active regions 22. Control gates 62/64 are continuously formed as conductive control gate (word) lines that each extends across both the active and isolation regions 22/24 to electrically connect together all the control gates in one row of memory cells. The above described process does not produce source regions 54 that extend across the isolation regions 24 (which can easily be done by removing the STI insulation material from the isolation region portions of second trenches 34 before ion implantation). However, poly blocks 56 (which are in electrical contact with source regions 54) are formed continuously across the isolation regions to adjacent active regions, and form conductive source lines each of which electrically connect together all the source regions 54 in one row of paired memory cells.

Memory Cell Operation

The operation of the memory cells will now be described. The operation and theory of operation of such memory cells are also described in U.S. Pat. No 5,572,054, whose disclosure is incorporated herein by reference with regard to the operation and theory of operation of a nonvolatile memory cell having a floating gate and a control gate, floating gate to control gate tunneling, and an array of memory cells formed thereby.

To initially erase a selected memory cell in any given active region 22, a ground potential is applied to both its source 54 and drain 72. The terms "source" and "drain" are interchangeable in MOS operation. In the following operation, "source" refers specifically to region 54 and "drain" to region 72 regardless of the electrical operation. A high-positive voltage (e.g. +8 volts) is applied to its control gate 62/64. Electrons on the floating gate 44/46b are induced through the Fowler-Nordheim tunneling mechanism to tunnel primarily from the floating gate lateral protrusion 44b, through the oxide layer 58, and onto the cavity 62a portion of control gate 62/64, leaving the floating gate 44/46b positively charged. Tunneling is enhanced by the sharpness of the tip 44c of protrusion 44b (and therefore the corresponding sharpness of the cavity 62a shape). The electric field line density across oxide layer 58 is more uniform that prior art designs given the uniform thickness of oxide layer 58 and the matching shapes of lateral protrusions/cavities 44b/62a. It should be noted that since each of the control gates 62/64 extends across the active and isolation regions as continuous word lines, one memory cell in each active region is 'erased' at the same time.

When a selected memory cell is desired to be programmed, a small voltage (e.g. 0.5 to 1.0 V) is applied to its drain region 72. A positive voltage level in the vicinity of the threshold voltage of the MOS structure (on the order of approximately +1.4 volts) is applied to its control gate 62/64. A positive high voltage (e.g. on the order of 5 or 6 volts) is applied to its source region 54. Electrons generated by the drain region 72 will flow therefrom towards the source region 54 through the deeply depleted horizontal portion 84b of the channel region 84. As the electrons reach the vertical portion 84a of the channel region 84, they will see the high potential of floating gate 44/46b (because the floating gate is strongly capacitive (voltage) coupled to the positively charged source region 54 and poly block 56). The electrons will accelerate and become heated, with most of them being injected into and through the insulating layer 42 and onto the floating gate 44/46b. Programming efficiency is enhanced by an injector tip formed by the substrate sharp edge 38, which focuses and more efficiently injects the electrons toward the floating gate 44/46b, thus reducing the time and source voltage needed to program the memory cell, as well as improving the dielectric integrity lifetime by lowering the average electric field voltage within the volume of the dielectric 42. Low or ground potential are applied to the source/drain regions 54/72 and control gates 62164 for memory cell rows/columns not containing the selected memory cell. Thus, only the memory cell in the selected row and column is programmed.

The injection of electrons onto the floating gate 44/46b will continue until the reduction of the charge on the floating gate can no longer sustain a high surface potential along the vertical channel region portion 84a to generate hot electrons. At that point, the electrons or the negative charges in the floating gate 44/46b will decrease the electron flow from the drain region 72 onto the floating gate.

Finally, to read a selected memory cell, ground potential is applied to its source region 54. A read voltage (e.g. ~1 volt) is applied to its drain region 72 and approximately 1.5 to 3.3 volts (depending upon the power supply voltage of the device) is applied to its control gate 62/64. If the floating gate 44/46b is positively charged (i.e. the floating gate is discharged of electrons), then the channel region portions 84a/84c (directly adjacent to the floating gate 44/46b) are turned on. When the control gate 62/64 is raised to the read potential, the horizontal channel region portion 84b (directly adjacent the control gate 62/64) is also turned on. Thus, the entire channel region 84 will be turned on, causing electrons to flow from the source region 54 to the drain region 72. This sensed electrical current would be the "1" state.

On the other hand, if the floating gate 44/46b is negatively charged, the channel region portions 84a/84c are either weakly turned on or are entirely shut off. Thus, when the control gate 62/64 and the drain region 72 are raised to the read potential, little or no current will flow through channel region portions 84a/84c. In this case, either the current is very small compared to that of the "1" state or there is no current at all. In this manner, the memory cell is sensed to be programmed at the "0" state. Ground potential is applied to the source/drain regions 54/72 and control gates 62/64 for non-selected columns and rows so only the selected memory cell is read.

The memory cell array includes peripheral circuitry including conventional row address decoding circuitry, column address decoding Circuitry, sense amplifier circuitry, output buffer circuitry and input buffer circuitry, which are well known in the art.

The present invention provides a memory cell array with reduced size and superior program and erase efficiency. Memory cell size is reduced significantly because the source regions 54 are buried inside the substrate 10, and are self aligned to the second trenches 34, where space is not wasted due to limitations in the lithography generation, contact alignment and contact integrity. Each floating gate 44/46b has a lower portion disposed in second trench 34 formed in the substrate for receiving the tunneling electrons during the program operation and for turning on the channel region portions 84a/84c during the read operation. Furthermore, having source region 54 and drain region 72 separated vertically as well as horizontally allows for easier optimization of reliability parameters without affecting cell size.

Program efficiency is greatly enhanced by "aiming" the horizontal portion 84b of the channel region 84 and the injector tip (sharp edge) 38 of substrate 10 at the floating gate 44/46b. In conventional programming schemes, the electrons in the channel region flow in a path parallel to the floating gate, where a relatively small number of the heated electrons arc injected onto the floating gate. The estimated program efficiency (number of electrons injected compared to total number of electrons) in such conventional programming schemes is estimated at about 1/1000. However, because the horizontal channel region portion 84b and injector tip (sharp edge) 38 define a focused electron path that is 'aimed' directly at the floating gate, the program efficiency of the present invention is estimated to be closer to 1/1, even with reduced programming voltages. Program efficiency is also enhanced by the capacitive coupling between each floating gate 44/46b and the corresponding source region 54 via the poly block 56 (electrically connected with the source region 54). At the same time, there is relatively low capacitive coupling between the floating gate 44/46b and the control gate 62/64 (which would hinder the erase operation).

Erase efficiency is greatly enhanced by providing a more uniform electric field between floating gate 44/46b and control gate 62/64, and across tunnel oxide layer 58. This more uniform electric field results from the floating gate lateral protrusion 44b extending into and having the same shape as control gate lateral cavity 62a. Oxide layer 58, which insulates lateral protrusion 44b from lateral cavity 62a, has a uniform thickness. Thus, whether protrusion/cavity 44b/62a have a more rounded shape, or have a more pointed sharp edge and concavity shape, their shapes match each other and are separated by an insulating layer of even thickness for Fowler Nordheim tunneling there-through during the erase operation. This memory cell design allows for easier scaling to smaller feature and cell sizes without compromising performance and reliability.

An important feature of the memory cell design of the present invention is that the capacitive coupling between the floating gate and the control gate is minimized and repeatable, while the capacitive coupling between the floating gate and source region is maximized. The floating gate/source region capacitive coupling is maximized because floating gate 44/46b extends over source region 54 at the bottom of second trench 34, and because poly block 56 (electrically connected to the source region 54) extends along the entire length of the floating gate 44/46b.

In contrast, only the floating gate lateral protrusion 44b, and that portion of the floating gate between the lateral protrusion 44b and the substrate surface, are in close proximity with the control gate (insulated therefrom by oxide layer 58). Thus, the size of the lateral protrusion 44b, and its height above the substrate surface (i.e. its height above substrate sharp edge 38), dictate the amount of capacitive coupling between the floating and control gates. Both of these variables are very controllable, as they are both dictated by the thicknesses of oxide layer 30 and nitride layer 28 (see FIGS. 3A–3K). Specifically, lateral protrusion 44b is formed by filling cavity 40 formed in oxide layer 30. As stated above with regard to FIG. 3D, the size and shape of cavity 40 is dictated by the thickness $T_2$ of oxide layer 30. Likewise, the height of lateral protrusion 44b above the substrate surface (and substrate sharp edge 38) is dictated by the thickness $T_1$, of nitride layer 28. Since material deposition thicknesses can be controlled with significant precision, so too can the capacitive coupling between floating gate 44/46b and control gate 62/64.

Figure 5A:
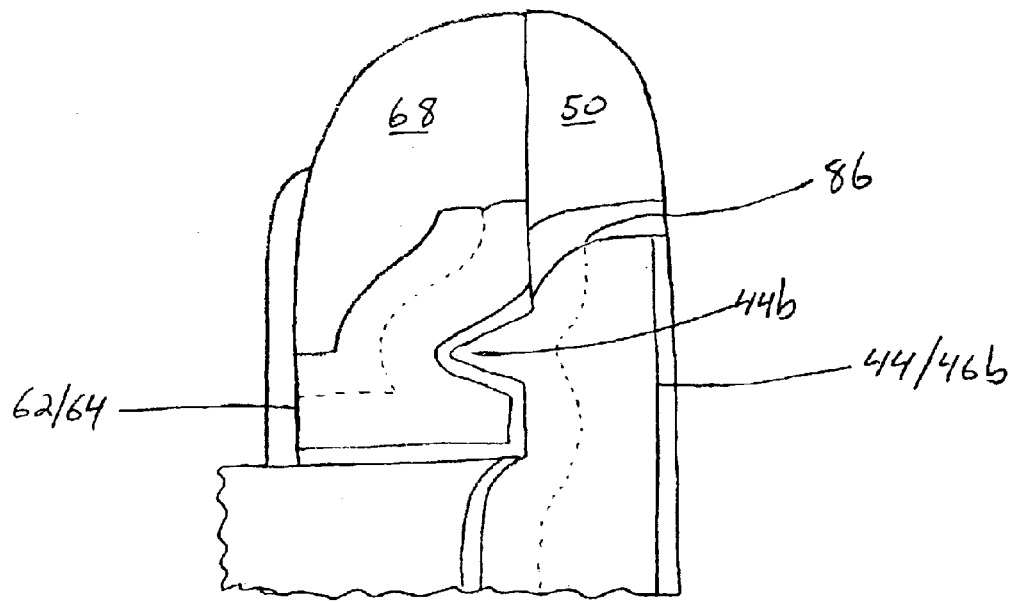
FIG. 5A is a partial cross sectional view illustrating the top surface of the floating gate.
Figure 5B:
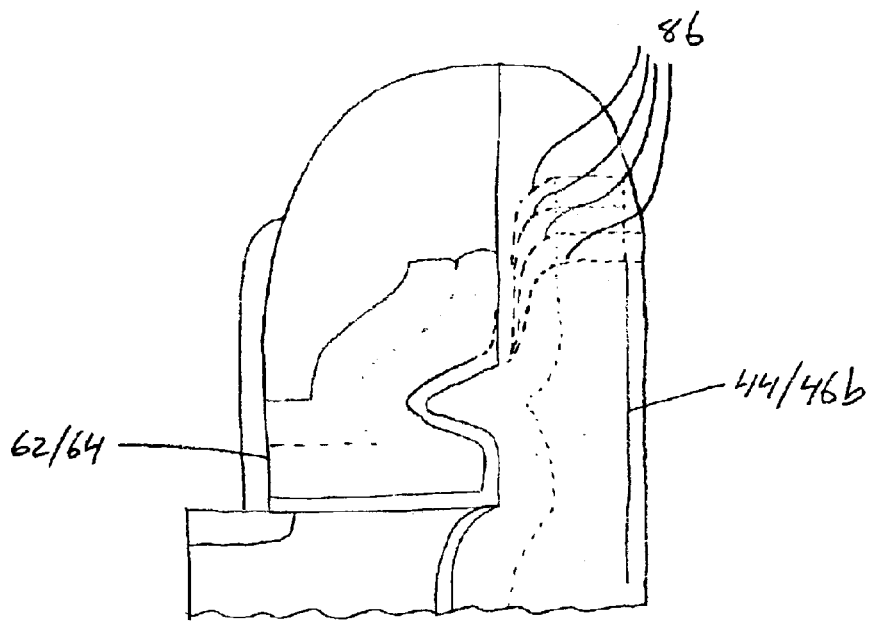
FIG. 5B is a partial cross sectional view illustrating various possible shapes of the floating gate upper surface that can result from a timed polysilicon etch process.

FIG. 5A shows the upper surface 86 of floating gate 44/46b, which extends above the lateral protrusion 44b. However, since floating gate upper surface 86 slopes away from control gate 62/64, and is not in close proximity therewith, it does not materially affect the capacitive coupling between the floating and control gates. As described above with respect to FIG. 3H, floating gate upper surface 86 is formed using a timed poly etch, which has no natural end point or etch stop layer, followed by thermal oxidation which also has no natural end point. However, even without reliable depth control for this timed etch process, the capacitive coupling between the floating and control gates is not materially affected by slightly over or under etching the poly layer/block 44/46. FIG. 5B illustrates various shapes of the floating gate upper surface 86 resulting from varying degrees of poly etching layer/block 44/46. No matter how far down the poly layer/block 44/46b are etched, the floating gate upper surface 86 is spaced away from the control gate for minimal capacitive coupling effect therebetween.

It is to be understood that the present invention is not limited to the embodiment(s) described above and illustrated herein, but encompasses any and all variations falling within the scope of the appended claims. For example, trenches 20/34 can end up having any shape that extends into the substrate, not just the elongated rectangular shape shown in the figures. Also, although the foregoing method describes the use of appropriately doped polysilicon as the conductive material used to form the memory cell components, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows for the proper formation of the memory cell of the present invention. Additionally, the above described invention is shown to be formed in a substrate which is shown to be uniformly doped, but it is well known and contemplated by the present invention that memory cell components can be formed in well regions of the substrate, which are regions that are doped to have a different conductivity type compared to other portions of the substrate. Lastly, single layers of insulating or conductive material could be formed as multiple layers of such materials, and vice versa.

What is claimed is:

1. A method of forming a semiconductor memory cell, comprising:
    forming a trench into a surface of a semiconductor substrate of a first conductivity type;
    forming first and second spaced-apart regions of a second conductivity type in the substrate with the first region formed underneath the trench, wherein a channel region is defined in the substrate between the first and second regions such that the channel region includes a first portion that extends substantially along a sidewall of the trench and a second portion that extends substantially along the substrate surface;
    forming an electrically conductive floating gate having lower and upper portions, wherein the lower portion is disposed in the trench adjacent to and insulated from the channel region first portion, and wherein the upper portion extends above the substrate surface and includes a lateral protrusion that extends in a direction substantially parallel to the substrate surface; and
    forming an electrically conductive control gate that is disposed over and insulated from the channel region second portion, and is disposed laterally adjacent to and insulated from the floating gate lateral protrusion.

2. The method of claim 1, wherein the formation of the control gate includes forming a cavity in the control gate such that the floating gate lateral protrusion extends into the control gate cavity.

3. The method of claim 2, further comprising:
    forming one or more layers of insulating material of uniform thickness between the control gate cavity and the floating gate lateral protrusion.

4. The method of claim 3, wherein the control gate cavity has a shape that matches that of the floating gate lateral protrusion.

5. The method of claim 1, wherein the formation of the floating gate lateral protrusion includes:
    forming a sacrificial layer of material over the substrate having an exposed end;
    performing an etch process that forms a lateral cavity in the exposed end; and
    forming a first layer of conductive material along the exposed end which fills the lateral cavity with the conductive material to form the lateral protrusion.

6. The method of claim 5, wherein the formation of the control gate includes:
    removing the sacrificial layer of material;
    forming one or more layers of insulating material along the lateral protrusion; and
    forming a second layer of conductive material along the one or more insulating layers.

7. The method of claim 1, wherein the formation of the floating gate lateral protrusion includes:
    forming a first sacrificial layer of material over the substrate having a thickness T1 and a first exposed end;
    forming a second sacrificial layer of material over the first sacrificial layer having a thickness T2 and a second exposed end;
    performing an etch process that forms a lateral cavity in the second exposed end; and
    forming a first layer of conductive material along the first and second exposed ends which fills the lateral cavity with the conductive material to form the lateral protrusion;
    wherein thickness T1, dictates a height of the lateral protrusion above the substrate surface, and thickness T2 dictates a size of the lateral protrusion.

8. The method of claim 7, wherein the formation of the control gate includes:
    removing the first and second sacrificial layers of material;
    forming one or more insulating layers of material over the substrate and along the lateral protrusion; and
    forming a second layer of conductive material along the insulating layer;
    wherein the thicknesses T1, and T2 dictate an amount of capacitive coupling between the control gate and the floating gate.

9. The method of claim 1, further comprising:
    modifying a shape of the trench sidewall so that the trench sidewall meets the substrate surface at an acute angle to form a sharp edge, wherein the channel region first and second portions are non-linear with respect to each other, with the channel region second portion extending from the second region in a direction toward the sharp edge and the floating gate to define a path for programming the floating gate with electrons via hot electron injection.

10. The method of claim 9, wherein the modifying of the trench sidewall shape includes:
forming a first oxide layer on the trench sidewall via silicon oxidation;
removing the first oxide layer; and
forming a second oxide layer on the trench sidewall via silicon oxidation.

11. The method of claim 10, wherein the formation of the first and second oxide layers causes the trench sidewall to meet the substrate surface at an angle substantially less than 90 degrees.

12. The method of claim 9, wherein the floating gate lateral protrusion terminates in a tip that points in a first direction, and wherein the sharp edge-points in a second direction that is opposite to the first direction.

13. The method of claim 1, further comprising:
forming a block of conductive material having at least a lower portion thereof disposed in the trench adjacent to and insulated from the floating gate.

14. The method of claim 13, wherein the conductive material block is formed to be electrically connected to the first region.

15. The method of claim 1, wherein the channel region includes a third portion extending substantially along at least a portion of a bottom surface of the trench, and wherein at least a portion of the floating gate is disposed over and insulated from the channel region third portion.

16. The method of claim 1, wherein the formation of the control gate includes:
forming a layer of polysilicon disposed over and insulated from the channel region second portion and disposed laterally adjacent to and insulated from at least a portion of the floating gate; and
forming a layer of metalized polysilicon on the polysilicon layer.

17. The method of claim 16, wherein the formation of the control gate further includes:
forming a spacer of material over the layers of polysilicon and metalized polysilicon, leaving portions of the layers of polysilicon and metalized polysilicon exposed; and
performing an etch process that removes the exposed portions of the layers of polysilicon and metalized polysilicon.

18. The method of claim 1, wherein the formation of the floating gate includes:
forming a layer of doped polysilicon along the trench sidewall;
forming a block of undoped polysilicon laterally adjacent to the layer of doped polysilicon; and
performing a poly etch to lower upper surfaces of the polysilicon layer and polysilicon block, wherein the upper surface of the doped polysilicon layer is etched down faster and lower than that of the undoped polysilicon block.

19. The method of claim 18, wherein the formation of the floating gate further includes:
oxidizing upper surfaces of the doped polysilicon layer and undoped polysilicon block, wherein the upper surface of the doped polysilicon layer oxidizes faster and deeper than that of the undoped polysilicon block.

20. A method of forming an array of electrically programmable and erasable memory devices, comprising:
forming spaced apart isolation regions on a semiconductor substrate that are substantially parallel to one another and extend in a first direction, with an active region between each pair of adjacent isolation regions, wherein the substrate has a surface and a first conductivity type; and
forming a plurality of memory cells in each of the active regions, wherein the formation of each of the memory cells includes:
forming a trench into a surface of a semiconductor substrate of a first conductivity type,
forming first and second spaced-apart regions of a second conductivity type in the substrate with the first region formed underneath the trench, wherein a channel region is defined in the substrate between the first and second regions such that the channel region includes a first portion that extends substantially along a sidewall of the trench and a second portion that extends substantially along the substrate surface,
forming an electrically conductive floating gate having lower and upper portions, wherein the lower portion is disposed in the trench adjacent to and insulated from the channel region first portion, and wherein the upper portion extends above the substrate surface and includes a lateral protrusion that extends in a direction substantially parallel to the substrate surface, and
forming an electrically conductive control gate that is disposed over and insulated from the channel region second portion, and is disposed laterally adjacent to and insulated from the floating gate lateral protrusion.

21. The method of claim 20, wherein the formation of the control gates includes forming a cavity in each of the control gates such that each of the floating gate lateral protrusions extends into one of the control gate cavities.

22. The method of claim 21, further comprising:
forming one or more layers of insulating material of uniform thickness between each of the control gate cavities and one of the floating gate lateral protrusions.

23. The method of claim 22, wherein the control gate cavities each have a shape that matches that of the floating gate lateral protrusion extending therein.

24. The method of claim 20, wherein the formation of the floating gate lateral protrusions includes:
forming a sacrificial layer of material over the substrate having exposed ends;
performing an etch process that forms lateral cavities in the exposed ends; and
forming a first layer of conductive material along the exposed ends which fills the lateral cavities with the conductive material to form the lateral protrusions.

25. The method of claim 24, wherein the formation of the control gates includes:
removing the sacrificial layer of material;
forming one or more layers of insulating material along the lateral protrusions; and
forming a second layer of conductive material along the one or more insulating layers.

26. The method of claim 20, wherein the formation of the floating gate lateral protrusions includes:
forming a first sacrificial layer of material over the substrate having a thickness T1, and first exposed ends;
forming a second sacrificial layer of material over the first sacrificial layer having a thickness T2 and second exposed ends;
performing an etch process that forms lateral cavities in the second exposed ends; and
forming a first layer of conductive material along the first and second exposed ends which fills the lateral cavities with the conductive material to form the lateral protrusions;

wherein thickness T1 dictates a height of the lateral protrusions above the substrate surface, and thickness T2 dictates a size of the lateral protrusions.

27. The method of claim 26, wherein the formation of the control gates includes: removing the first and second sacrificial layers of material;

forming one or more insulating layers of material over the substrate and along the lateral protrusions; and forming a second layer of conductive material along the insulating layer, wherein the thicknesses T1, and T2 dictate an amount of capacitive coupling between the control gates and the floating gates.

28. The method of claim 20, further comprising:

modifying a shape of each of the trench sidewalls so that each trench sidewall meets the substrate surface at an acute angle to form a sharp edge, wherein the channel regions are nonlinear such that each channel region second portion extends from one of the second regions in a direction toward one of the sharp edges and one of the floating gates to define a path for programming the one floating gate with electrons via hot electron injection.

29. The method of claim 28, wherein the modifying of the trench sidewalls includes:

forming a first oxide layer on the trench sidewalls via silicon oxidation;

removing the first oxide layer, and forming a second oxide layer on the trench sidewalls via silicon oxidation.

30. The method of claim 29, wherein the formation of the first and second oxide layers causes each of the trench sidewalls to meet the substrate surface at an angle substantially less than 90 degrees.

31. The method of claim 28, wherein for each of the memory cells, the floating gate lateral protrusion terminates in a tip that points in a second direction, and wherein the sharp edge points in a third direction that is opposite to the second direction.

32. The method of claim 20, further comprising:

forming blocks of conductive material each having at least a lower portion thereof disposed in one of the trenches adjacent to and insulated from one of the floating gates.

33. The method of claim 32, wherein each of the conductive material blocks is formed to be electrically connected to one of the first regions.

34. The method of claim 20, wherein each of the channel regions includes a third portion extending substantially along at least a portion of a bottom surface of one of the trenches, and wherein at least a portion of one of the floating gates is disposed over and insulated from one of the channel region third portions.

35. The method of claim 20, wherein the formation of the control gates includes:

forming a layer of polysilicon disposed over and insulated from the channel region second portions and disposed laterally adjacent to and insulated from the floating gate upper portions; and forming a layer of metalized polysilicon on the polysilicon layer.

36. The method of claim 35, wherein the formation of the control gates further includes:

forming spacers of material over the layers of polysilicon and metalized polysilicon, leaving portions of the layers of polysilicon and metalized polysilicon exposed; and performing an etch process that removes the exposed portions of the layers of polysilicon and metalized polysilicon.

37. The method of claim 20, wherein the formation of the floating gates includes:

forming a layer of doped polysilicon along the trench sidewalls;

forming blocks of undoped polysilicon laterally adjacent to the doped polysilicon; and performing a poly etch to lower upper surfaces of the doped polysilicon and undoped polysilicon blocks, wherein the upper surfaces of the doped polysilicon are etched down faster and lower than that of the undoped polysilicon blocks.

38. The method of claim 37, wherein the formation of the floating gates further includes:

oxidizing upper surfaces of the doped polysilicon and undoped polysilicon blocks, wherein the upper surfaces of the doped polysilicon oxidizes faster and deeper than that of the undoped polysilicon blocks.

39. The method of claim 20, wherein the formation of the control gates further includes forming a plurality of control lines of conductive material each extending across the active and isolation regions in a second direction perpendicular to the first direction and each electrically connecting together one of the control gates from each of the active regions.

40. The method of claim 32, wherein the formation of the conductive material blocks further includes forming a plurality of source lines of conductive material each extending across the active and isolation regions in a second direction perpendicular to the first direction and each electrically connecting together one of the conductive material blocks from each of the active regions.

41. The method of claim 20, further comprising:

forming a plurality of drain lines of conductive material each extending along one of the active regions and electrically connecting together all of the second regions in the one active region.

* * * * *